United States Patent
Hembree et al.

(10) Patent No.: US 6,806,493 B1
(45) Date of Patent: Oct. 19, 2004

(54) SPRING ELEMENT FOR USE IN AN APPARATUS FOR ATTACHING TO A SEMICONDUCTOR AND A METHOD OF ATTACHING

(75) Inventors: David R. Hembree, Boise, ID (US); Salman Akram, Boise, ID (US); Derek Gochnour, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/026,080

(22) Filed: Feb. 19, 1998

Related U.S. Application Data

(63) Continuation-in-part of application No. 09/009,169, filed on Jan. 20, 1998, now Pat. No. 6,456,100.

(51) Int. Cl.⁷ .................................................. H01L 23/58
(52) U.S. Cl. .................................... 257/48; 361/752
(58) Field of Search ........................... 257/48, 727, 712, 257/713; 361/752

(56) References Cited

U.S. PATENT DOCUMENTS

| | | | |
|---|---|---|---|
| 3,795,037 A | * | 3/1974 | Luttmer ...................... 29/628 |
| 4,340,860 A | | 7/1982 | Teeple, Jr. |
| 4,474,851 A | | 10/1984 | Urry |
| 4,667,154 A | | 5/1987 | Allerton et al. |
| 4,870,356 A | | 9/1989 | Tingley |
| 4,916,523 A | | 4/1990 | Sokolovsky et al. |
| 4,998,885 A | | 3/1991 | Beaman |
| 5,014,161 A | | 5/1991 | Lee et al. |
| 5,014,967 A | | 5/1991 | Wolf et al. |
| 5,140,405 A | * | 8/1992 | King et al. ................. 257/727 |
| 5,175,613 A | | 12/1992 | Barker et al. |
| 5,192,479 A | | 3/1993 | Harasz et al. |
| 5,302,891 A | | 4/1994 | Wood et al. |
| 5,326,428 A | | 7/1994 | Farnworth et al. |
| 5,395,260 A | | 3/1995 | Hayakawa et al. |
| 5,402,004 A | * | 3/1995 | Ozmat ........................ 257/718 |
| 5,402,077 A | | 3/1995 | Agahdel et al. |
| 5,408,190 A | | 4/1995 | Wood et al. |
| 5,418,469 A | | 5/1995 | Turner et al. |
| 5,419,807 A | | 5/1995 | Akram et al. |
| 5,459,352 A | * | 10/1995 | Layton et al. .............. 257/718 |
| 5,483,741 A | | 1/1996 | Akram et al. |
| 5,495,179 A | | 2/1996 | Wood et al. |
| 5,497,103 A | | 3/1996 | Ebert et al. |
| 5,500,556 A | | 3/1996 | Kosugi |

(List continued on next page.)

OTHER PUBLICATIONS

Fjelstad, Joseph, "A Return to Order Standard Grid Pitches in Advanced Electronic Assembly", Mar./Apr. 1997, *Advanced Packaging's Guide to Emerging Technologies*, pp. 8–10.

Brathwaite, Nic, "Contracting the Future An EMS Overview of Today's Emerging Technologies" Mar./Apr. 1997, *Advanced Packaging's Guide to Emerging Technologies*.

Boyd Corporation Sales Brochure, 8/96.

*Primary Examiner*—Roy Potter
(74) *Attorney, Agent, or Firm*—Dinsmore & Shohl LLP

(57) ABSTRACT

A spring element used in a temporary package for testing semiconductors is provided. The spring element is compressed so as to press the semiconductor, either in the form of a bare semiconductor die or as part of a package, against an interconnect structure. The spring element is configured so that it provides sufficient pressure to keep the contacts on the semiconductor in electrical contact with the interconnect structure. Material is added and/or removed from the spring element so that it has the desired modulus of elasticity. The shape of the spring element may also be varied to change the modulus of elasticity, the spring constant, and the force transfer capabilities of the spring element. The spring element also includes conductive material to increase the thermal and electrical conductivity of the spring element.

24 Claims, 9 Drawing Sheets

U.S. PATENT DOCUMENTS

| | | |
|---|---|---|
| 5,519,332 A | 5/1996 | Wood et al. |
| 5,541,525 A | 7/1996 | Wood et al. |
| 5,572,140 A | 11/1996 | Lim et al. |
| 5,581,195 A | 12/1996 | Lee et al. |
| 5,639,247 A | 6/1997 | Johnson et al. |
| 5,726,580 A | 3/1998 | Wood et al. |
| 5,742,169 A | 4/1998 | Akram et al. |
| 5,783,461 A | 7/1998 | Hembree |
| 5,810,607 A | 9/1998 | Shih et al. |
| 5,815,000 A | 9/1998 | Farnworth et al. |
| 5,892,245 A * | 4/1999 | Hilton ........................ 257/727 |
| 5,914,864 A * | 6/1999 | MacDonald ................ 361/752 |
| 5,926,029 A | 7/1999 | Ference et al. |
| 5,947,750 A | 9/1999 | Alcoe et al. |
| 6,028,437 A | 2/2000 | Potter |
| 6,046,060 A | 4/2000 | Budnaitis |
| 6,060,894 A | 5/2000 | Hembree et al. |
| 6,062,873 A | 5/2000 | Kato |
| 6,064,217 A | 5/2000 | Smith |
| 6,069,028 A | 5/2000 | Stroupe |
| 6,091,251 A | 7/2000 | Wood et al. |
| 6,093,468 A | 7/2000 | Toms et al. |
| 6,106,305 A | 8/2000 | Kozel et al. |
| 6,229,320 B1 | 5/2001 | Haseyama et al. |
| 6,333,638 B1 | 12/2001 | Fukasawa et al. |
| 6,388,458 B1 | 5/2002 | Hembree et al. |
| 6,411,116 B1 | 6/2002 | DeHaven et al. |
| 6,456,100 B1 | 9/2002 | Hembree et al. |
| 6,598,290 B2 * | 7/2003 | Hembree et al. .............. 29/845 |

\* cited by examiner

SPRING ELEMENT FOR USE IN AN APPARATUS FOR ATTACHING TO A SEMICONDUCTOR AND A METHOD OF ATTACHING

CROSS REFERENCE TO RELATED APPLICATIONS

This application is a Continuation-in-Part of U.S. patent application Ser. No. 09/009,169, filed Jan. 20, 1998 now U.S. Pat. No. 6,456,100.

BACKGROUND OF THE INVENTION

The present invention relates in general to spring elements, and, more particularly, to a spring element for use in an apparatus for attaching to a plurality of contacts of a semiconductor.

Unpackaged or bare semiconductor dies are used to construct multi-chip modules (MCMs) and other electronic devices. Unpackaged dies must be tested and burned in during the manufacturing process to certify each die as a known good die. This has led to the development of temporary packages that hold a single bare die for testing and burn-in. The temporary packages provide the electrical interconnection between the test pads on the die and external test circuitry. Exemplary temporary packages are disclosed in U.S. Pat. Nos. 5,302,891, 5,408,190 and 5,495,179 to Wood et al., which are herein incorporated by reference.

Typically, this type of temporary package includes an interconnect having contact members that make a temporary electrical connection with the test pads on the die. The temporary package can also include an attachment device that presses the die against the interconnect. The attachment device may include a clamping device that attaches to a package base and a spring element that presses the die against the interconnect. The configuration of the spring element is dependent on a number of factors. The spring element must be able to withstand relatively high compressive forces and relatively high burn-in temperatures without experiencing compression set. Further, the dimensions of the spring element must be such that it is compatible with the temporary package. Finally, the spring element must be able to withstand the amount of pressure required for pressing the die against the interconnect without causing an excessive amount of force to be transferred to the die, and thus damaging the same.

Springs elements used in the prior art are typically formed using rubber-like materials, such as silicone. Such springs elements are poor conductors of heat and electricity which limits the applications in which they can be used. It would be desirable to have a spring element which was electrically conductive for backside biasing of the semiconductor being tested. It would also be desirable to have a spring element which had improved thermal conduction properties for those applications in which increased heat dissipation is necessary.

Accordingly, there is a need for a spring element which is compatible with the temporary packages and environment used to test and burn-in semiconductors. There is also a need for a spring element which has improved thermal and electrical conduction properties. Preferably, such spring elements would be reusable and inexpensive to manufacture.

SUMMARY OF THE INVENTION

The present invention meets this need by providing a spring element having a modulus of elasticity which may be adjusted according to the required environment. Metallic particles or films may be added to the spring element to increase its thermal and electrical conduction properties. The spring element may be wrapped in a metallized woven fabric and mechanically clamped to the cover of the semiconductor testing device, thereby alleviating the need for a load distributing pressure plate. Material may be removed from or added to the spring element to change the modulus of elasticity as needed. The shape of the spring element may also be varied to change the modulus of elasticity, the spring constant, and the force transfer capabilities of the spring element.

According to a first aspect of the present invention, a spring element comprises a first elastic member and a conductive member. The first elastic member is comprised of a first elastomeric material having a first modulus of elasticity. A portion of the first elastomeric material is removed from the first elastic member such that the spring element has an overall modulus of elasticity different from the first modulus of elasticity.

The portion of the first elastomeric material removed from the first elastic member may form a hole in the first elastic member. Preferably, the first elastic member is o-ring shaped. The first elastic member may also comprise a plurality of holes. The spring element may further comprise a second elastic member comprised of a second elastomeric material having a second modulus of elasticity, with the second elastic member being positioned in at least one of the plurality of holes formed in the first elastic member such that the overall modulus of elasticity is different from the first and second moduli of elasticity. The spring element may further comprise a plurality of the second elastic members with the plurality of the second elastic members being positioned in a plurality of the plurality of holes in the first elastic member. The portion of the first elastomeric material removed from the first elastic member may form a cavity in the first elastic member. Preferably, the first elastic member includes a plurality of cavities formed therein.

The conductive member may comprise a plurality of conductive particles. Preferably, the plurality of conductive particles are interspersed within the first elastic member. Alternatively, the conductive member may comprise a layer of conductive material formed over the first elastic member or a plurality of conductive threads. The plurality of conductive threads may comprise a plurality of non-conductive threads having a conductive coating. Preferably, the plurality of conductive threads form a covering around the first elastic member. The conductive member may be comprised of conductive material selected from the group consisting of gold, aluminum, nickel, silver stainless steel, and alloys thereof. The conductive member may also be comprised of carbon.

According to another aspect of the present invention, a spring element comprises a first elastic member, a second elastic member and a conductive member. The first elastic member is comprised of a first elastomeric material having a first modulus of elasticity and the second elastic member is comprised of a second elastomeric material having a second modulus of elasticity. The second elastic member is positioned within the first elastic member such that the spring element has an overall modulus of elasticity different from the first and second moduli of elasticity.

The spring element may further comprise a plurality of the second elastic members positioned within the first elastic member. The conductive member may comprise a plurality of conductive particles, a layer of conductive material formed over the first elastic member, or a plurality of conductive threads.

According to a further aspect of the present invention, a spring element comprises a plurality of interwoven threads and a conductive member. The conductive member may comprise a plurality of conductive particles, a layer of conductive material formed over the first elastic member, or a plurality of conductive threads. Preferably, the plurality of conductive threads are interwoven with the plurality of interwoven threads.

According to yet another aspect of the present invention, a spring element comprises a conductive member and an elastic member having a variable spring constant. The conductive member may comprise a plurality of conductive particles, a layer of conductive material formed over the first elastic member, or a plurality of conductive threads.

According to another aspect of the present invention, an apparatus for attaching to a plurality of contacts of a semiconductor comprises an interconnect structure comprising a plurality of conductors patterned to match corresponding ones of the plurality of contacts of the semiconductor and an attachment device pressing the interconnect structure against the semiconductor to provide an electrical connection between the plurality of conductors and the corresponding ones of the plurality of contacts. The attachment device comprises a spring element including an elastomeric member and a conductive member.

The conductive member may comprise a plurality of conductive particles. Preferably, the plurality of conductive particles are interspersed within the first elastic member. Alternatively, the conductive member may comprise a layer of conductive material formed over the first elastic member or a plurality of conductive threads. The plurality of conductive threads may comprise a plurality of non-conductive threads having a conductive coating. Preferably, the plurality of conductive threads form a covering around the first elastic member. Preferably, the conductive member is comprised of conductive material selected from the group consisting of gold, aluminum, nickel, silver, stainless steel, and alloys thereof. The conductive member may also be comprised of carbon.

The semiconductor may be electrically biased through the spring element. The semiconductor may comprise a semiconductor die. The semiconductor may comprise a semiconductor die formed within a semiconductor package. The semiconductor package may comprise a package selected from the group consisting of a chip-scale package, a ball grid array, a chip-on-board, a direct chip attach, and a flip-chip.

According to yet another aspect of the present invention, an apparatus for attaching to a plurality of contacts of a semiconductor comprises an interconnect structure comprising a plurality of conductors patterned to match corresponding ones of the plurality of contacts of the semiconductor and an attachment device pressing the interconnect structure against the semiconductor to provide an electrical connection between the plurality of conductors and the corresponding ones of the plurality of contacts. The attachment device comprises a cover and a spring element mechanically coupled to the cover. The spring element comprises an elastomeric member and a plurality of conductive threads forming a covering over the spring element.

The cover may comprise a first clamping member configured so that a first end portion of the spring element is force fit to the cover. The cover may further comprise a second clamping member configured so that a second end portion of the spring element is force fit to the cover.

According to a further aspect of the present invention, an apparatus for attaching to a plurality of contacts of a semiconductor comprises an interconnect structure comprising a plurality of conductors patterned to match corresponding ones of the plurality of contacts of the semiconductor and an attachment device pressing the interconnect structure against the semiconductor to provide an electrical connection between the plurality of conductors and the corresponding ones of the plurality of contacts. The attachment device comprises a spring element including a conductive member and a first elastic member comprised of a first elastomeric material having a first modulus of elasticity. The first elastic member includes a plurality of holes formed therein such that the spring element has an overall modulus of elasticity different from the first modulus of elasticity.

According to a still further aspect of the present invention, an apparatus for attaching to a plurality of contacts of a semiconductor comprises an interconnect structure comprising a plurality of conductors patterned to match corresponding ones of the plurality of contacts of the semiconductor and an attachment device pressing the interconnect structure against the semiconductor to provide an electrical connection between the plurality of conductors and the corresponding ones of the plurality of contacts. The attachment device comprises a spring element including an elastic member comprised of a conductive member and an elastomeric material having a modulus of elasticity. The elastic member includes a hole formed therein such that the spring element has an overall modulus of elasticity different from the modulus of elasticity of the elastomeric material. The elastic member is shaped so as to engage an outer edge of the semiconductor such that a force applied by the attachment device as the interconnect structure is pressed against the semiconductor is substantially uniform around the semiconductor.

According to yet a still further aspect of the present invention, an apparatus for attaching to a plurality of contacts of a semiconductor comprises an interconnect structure comprising a plurality of conductors patterned to match corresponding ones of the plurality of contacts of the semiconductor and an attachment device pressing the interconnect structure against the semiconductor to provide an electrical connection between the plurality of conductors and the corresponding ones of the plurality of contacts. The attachment device comprises a spring element including a first elastic member, a second elastic member and a conductive member. The first elastic member comprises a first elastomeric material having a first modulus of elasticity and the second elastic member comprises a second elastomeric material having a second modulus of elasticity. The second elastic member is positioned within the first elastic member such that the spring element has an overall modulus of elasticity different from the first and second moduli of elasticity.

According to another aspect of the present invention, an apparatus for attaching to a plurality of contacts of a semiconductor comprises an interconnect structure comprising a plurality of conductors patterned to match corresponding ones of the plurality of contacts on the semiconductor and an attachment device pressing the interconnect structure against the semiconductor to provide an electrical connection between the plurality of conductors and the corresponding ones of the plurality of contacts. The attachment device comprises a spring element comprised of a plurality of interwoven threads and a conductive member.

According to yet another aspect of the present invention, an apparatus for attaching to a plurality of contacts of a semiconductor comprises an interconnect structure comprising a plurality of conductors patterned to match corresponding ones of the plurality of contacts of the semiconductor and an attachment device pressing the interconnect structure against the semiconductor to provide an electrical connection between the plurality of conductors and the corresponding ones of the plurality of contacts. The attachment device comprises a spring element including a conductive member and an elastic member comprised of an elastomeric material having a modulus of elasticity. The elastic member includes at least one cavity formed therein such that the spring element has an overall modulus of elasticity different from the modulus of elasticity of the elastomeric material.

According to a further aspect of the present invention, an apparatus for attaching to a plurality of contacts of a semiconductor comprises an interconnect structure comprising a plurality of conductors patterned to match corresponding ones of the plurality of contacts of the semiconductor and an attachment device pressing the interconnect structure against the semiconductor to provide an electrical connection between the plurality of conductors and the corresponding ones of the plurality of contacts. The attachment device comprises a spring element including a conductive member and an elastic member having a variable spring constant.

Accordingly, it is an object of the present invention to provide a spring element which is compatible with the temporary packages and environment used to test and burn-in semiconductors. It is another object of the present invention to provide a spring element which has improved thermal and electrical conduction properties. It is another object of the present invention to provide a spring element which is reusable and inexpensive to manufacture. Other features and advantages of the invention will be apparent from the following description, the accompanying drawings, and the appended claims.

DETAILED DESCRIPTION OF THE PREFERRED EMBODIMENTS

Figure 1:
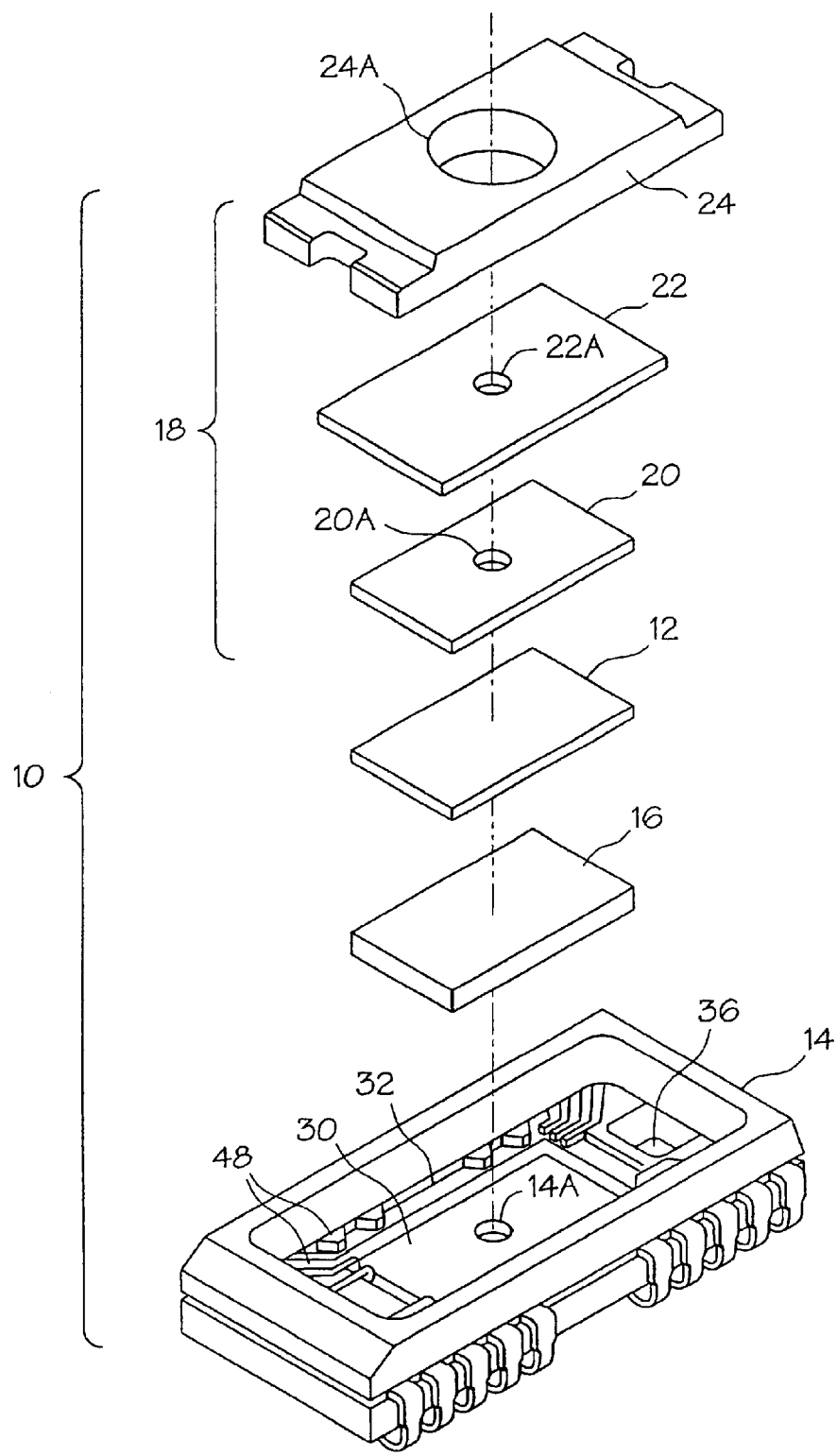
FIG. 1 is an exploded view of a temporary package for testing semiconductors.
Figure 2:
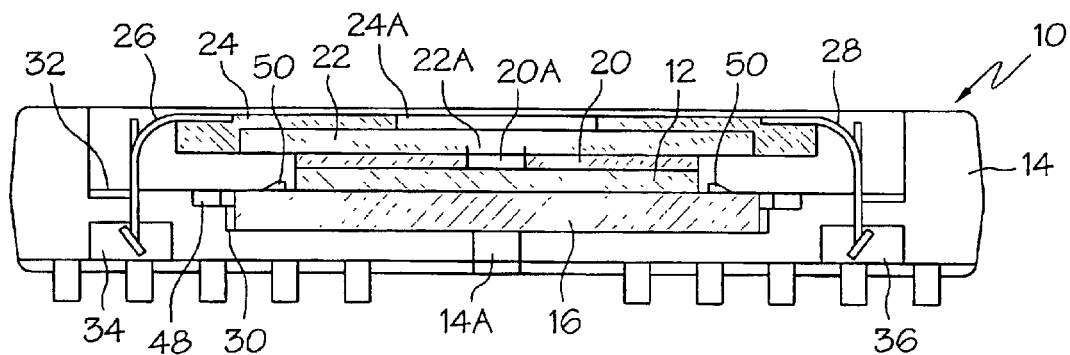
FIG. 2 is a cross-sectional view of the assembled temporary package shown in FIG. 1.

Referring now to FIGS. 1 and 2, a typical temporary package 10 used for testing a semiconductor 12 is shown. The temporary package 10 includes a package base 14, an interconnect structure 16, and an attachment device 18. The interconnect structure 16 establishes electrical communication between the package base 14 and the semiconductor 12. The attachment device 18 secures the semiconductor 12 to the package base 14 and presses the semiconductor 12 against the interconnect structure 16. The attachment device 18 includes a pressure plate 20, a spring element 22, a cover 24 and a pair of clips 26, 28.

The interconnect structure 16 is positioned within a recess 30 formed within the package base 14. The semiconductor 12 is positioned over the interconnect structure 16 and held within another recess 32 formed within the package base 14. The spring element 22 is secured to the cover 24 using an appropriate adhesive. However, it will be appreciated by those skilled in the art that the spring element 22 may used without being secured to the cover 24. The pressure plate 20 overlies the semiconductor 12 and is pressed against the semiconductor 12 by the spring element 22 and the cover 24. Accordingly, the semiconductor 12 is pressed against the interconnect structure 16 thereby establishing an electrical connection between the semiconductor 12, the interconnect structure 16 and the package base 14.

The cover 24 is secured to package base 16 by the clips 26 and 28. The clips 26, 28 engage a top portion of the cover 24 and are secured to the package base 14 through corresponding openings 34, 36 in the base 14. It will be appreciated by those skilled in the art that other types of latching mechanisms may be used to secure the cover 24 to the package base 14. The cover 24, the spring element 22, the pressure plate 20 and the package base 14 each include a central opening which are designated 24A, 22A, 20A and 14A, respectively. The openings 24A, 22A, 20A and 14A are used during assembly of the package 10 to permit the semiconductor 12 to be held by a vacuum tool (not shown) during optical alignment of the semiconductor 12 and the interconnect structure 16. The vacuum tool may also be used to disassemble the package 10 as required.

Figure 3:
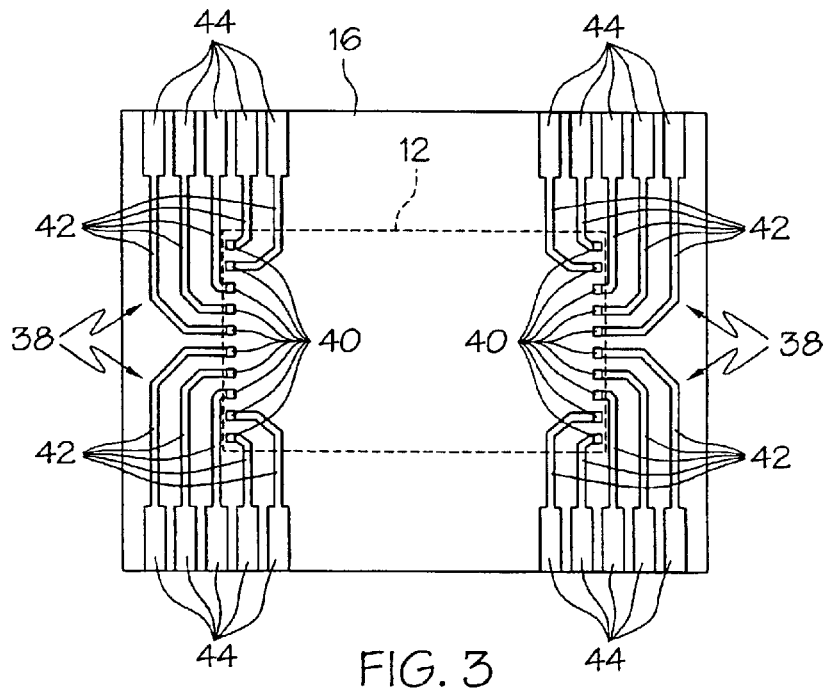
FIG. 3 is a plan view of an interconnect structure for testing semiconductor dies used in the temporary package of FIG. 1 according to first aspect of the present invention.
Figure 4:
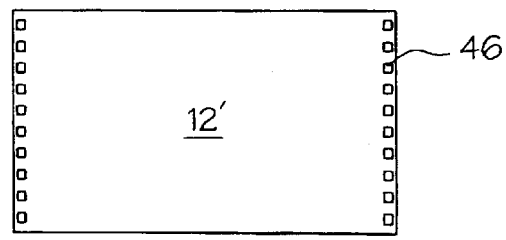
FIG. 4 is a schematic plan view of a semiconductor die to be tested in the temporary package of FIG. 1 according to the first aspect of the present invention.

The apparatus 10 may be used to test semiconductors 12 in a variety of forms. According to a first aspect of the present invention, the apparatus 10 is used to test bare semiconductor dies 12', see FIG. 4. The interconnect structure 16 is arranged so as to interface with such semiconductor dies 12'. Referring to FIG. 3, the interconnect structure 16 includes a plurality of conductors 38. Each of the plurality of conductors 38 includes a contact member 40, a connection line 42 and a bonding site 44. The contact members 40 are formed in a pattern which correspond to a plurality of contacts or bond pads 46 on the semiconductor die 12'; see also FIG. 4. The contact members 40 are adapted to contact and establish an electrical connection with the bond pads 46 on the semiconductor die 12'. For example, the contact members 40 may include a raised portion (not shown) which contacts the bond pads 46 as the semiconductor die 12' is pressed against the interconnect structure 16. The connection lines 42 terminate at the bonding sites 44 for connection to the package base 14. The bonding sites are connected to respective conductive traces 48 on the package base 14 using bond wires 50. The interconnect structure 16 may include a number of test structures (not shown) for evaluating various electrical characteristics of the interconnect structure 16. Once assembled, the semiconductor die 12' may be tested and burned-in as desired.

In the illustrated embodiment, the interconnect 16 is formed of a silicon substrate using conventional semiconductor technology. Similarly, the plurality of conductors 38 are formed of an appropriate conductive material using conventional semiconductor technology. The interconnect structure 16 may be formed according to U.S. Pat. Nos. 5,326,428; 5,419,807 and 5,483,741 which are herein incorporated by reference. In the illustrated embodiment, the semiconductor die 12' is formed of a silicon substrate with a number of additional semiconductor layers forming the desired semiconductor device using conventional semiconductor technology. It will be appreciated by those skilled in the art that the semiconductor die 12' may be formed of other semiconductor materials, such as gallium arsenide.

Figure 5:
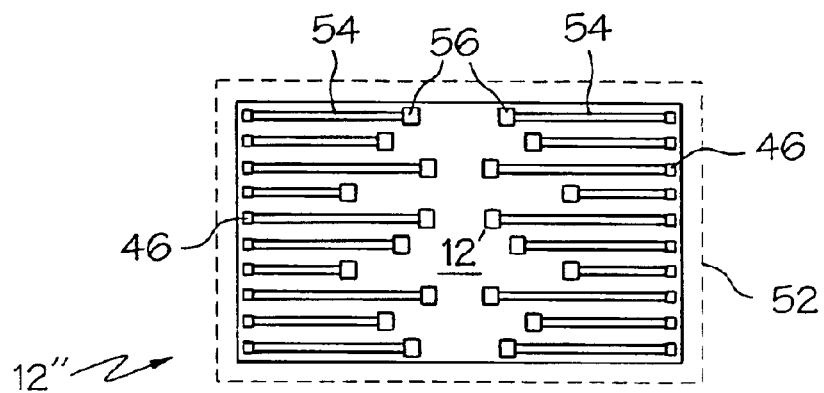
FIG. 5 is a schematic plan view of a semiconductor package to be tested in the temporary package of FIG. 1 according to a second aspect of the present invention.
Figure 6:
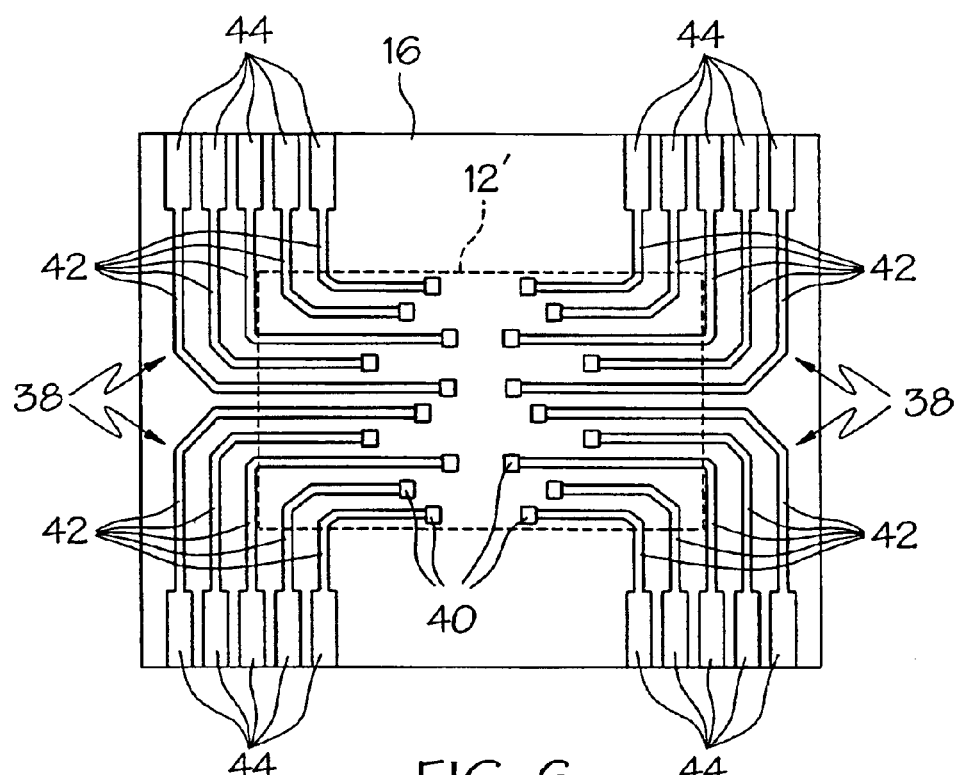
FIG. 6 is a plan view of an interconnect structure for testing semiconductor packages used in the temporary package of FIG. 1 according to the second aspect of the present invention.

According to a second aspect of the present invention, the apparatus 10 is used to test semiconductor packages 12"; see FIG. 5. The semiconductor package 12" includes at least one semiconductor die 12' and an additional structure 52. The structure 52 basically reroutes the bond pads 46 from the edge of the semiconductor die 12' towards the center of the semiconductor die 12'. This rerouting reduces the precision required for aligning the bond pads 46 with the contact members 40 as there is a greater area in which to position the bond pads 46. The structure 52 includes a plurality of conductive traces 54 electrically coupled to respective bond pads 46. The traces 54 are routed toward the center of the semiconductor die 12' in any desired pattern. The end of each trace 54 includes bonding member 56, such a solder ball. The bonding member 56 is typically larger than the corresponding bond pad 46 such that the precision in aligning the contact members 40 with the bonding member 56 is reduced. The semiconductor package 12" may comprise a chip-scale package (CSP), ball grid array (BGA), chip-on-board (COB), direct chip attach (DCA), flip-chips and other similar packages. As shown in FIG. 6, the interface structure 16 is arranged and configured to interface with the semiconductor package 12" as is known in the art. It should be apparent from the above description that the semiconductor 12 may comprise bare semiconductor dies and semiconductor dies arranged in packages as is known in the art.

The spring element 22 is composed of an elastomeric material. In the illustrated embodiment, the elastomeric material comprises silicone as it is compatible with the high temperatures associated with burn-in. However, silicone and the silicon used to form the semiconductor 12 tend to bond together due to molecular surface attraction and the compressive forces encountered as the semiconductor 12 is pressed against the interconnect structure 16. Such a bond could damage the underlying structures of the semiconductor 12 as well as the semiconductor 12 itself as the semiconductor 12 and the spring element 22 are separated. The pressure plate 20 acts as an interface between the semiconductor 12 and the spring element 22 to prevent such a bond from forming. The pressure plate 20 is thus composed of a suitable material which is compatible with the spring element 22 and the semiconductor 12 so as to prevent a bond from forming between any of the aforementioned structures. It will be appreciated by those skilled in the art that spring element 22 may be composed of other elastomeric materials, such as appropriate urethanes and polyesters. Further, the pressure plate 20 may be omitted if the material used to form the spring element 22 does not bond to the semiconductor 12 when subjected to high pressure and temperature. The pressure plate also distributes the force from the spring element 22 in a uniform manner.

Typically, the semiconductor 12 and the temporary package are relatively small thereby limiting the area or thickness of the spring element 22. The thickness of the spring element 22 may range between approximately 15 mils (0.381 mm) to approximately 125 mils (3.177 mm). However, it will be appreciated by those skilled in the art that the spring element 22 may be any desired thickness depending on the particular package 10 and semiconductor 12. The spring element 22 absorbs some of the force or pressure applied to it as it is compressed by the cover 24. The spring element 22 is sized and configured to transfer a desired amount of pressure to the semiconductor 12. A sufficient amount of pressure needs be applied to the semiconductor 12 so that it properly engages the interconnect structure 16. However, an excessive amount of pressure could damage the semiconductor 12 and the interconnect structure 16. As the dimensions of the spring element 22 are limited due to the size of the semiconductor 12 and the package 10, the configuration of the spring element 22 may be changed so that it exhibits the desired pressure absorption and force transfer characteristics.

The force applied by the spring element 22 may be changed by changing the area of the spring element 22 to be compressed. For example, a pressure plate 20 which is larger than the outer dimensions of the semiconductor 12 may be used with a lower psi spring element 22. The larger pressure plate 20 limits the overall compression height of the spring element 22 while applying the appropriate amount of force. Reducing the amount that the spring element 22 is compressed lessens the compression set of the spring element 2.

One feature of the spring element 22 which may be changed is its modulus of elasticity. Lowering the modulus of elasticity of the spring element 22 would enable it to absorb more force or pressure so that the amount of pressure applied to the semiconductor 12 is within acceptable levels. Another way of describing such function is forming low psi (lbs. per square inch) materials from high psi materials. Conversely, the modulus of elasticity may be increased so as to lessen the amount of force or pressure absorbed by the spring element 22 and thus increase the amount of force or pressure applied to the semiconductor 12 for a given deflection amount.

Figure 7:
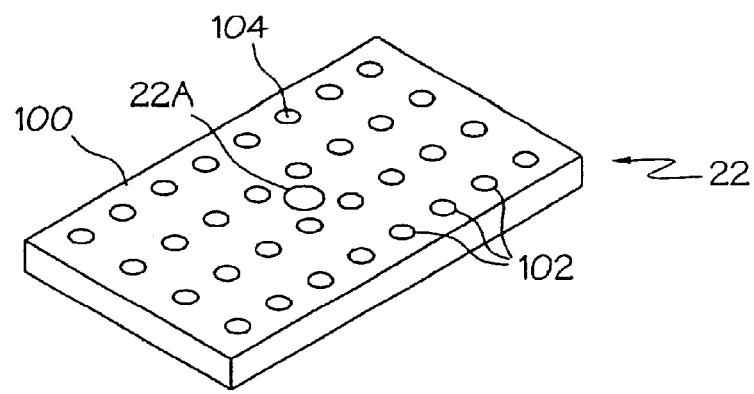
FIG. 7 is a perspective view of a spring element according to a first embodiment of the present invention.

Referring now to FIG. 7, the spring element 22 according to a first embodiment of the present invention is shown. The spring element 22 comprises a first elastic member 100 comprised of a first elastomeric material having a first modulus of elasticity. In the illustrated embodiment, the first elastomeric material comprises silicone. The silicone may be substantially solid or foam-like by having gas bubbles blown through it during fabrication using conventional methods. It should be apparent that the first modulus of elasticity is dependent, in part, on the configuration of the silicone as being foam-like or substantially solid. Foam-like material is more easily compressed than substantially solid material as the gas bubbles in the foam-like material are more easily compressible. A plurality of openings 102 are formed in the first elastic member 100 in addition to the opening 22A described above. The plurality of openings 102 may extend partially or completely through the first elastic member 100. The plurality of openings 102 are formed by wet drilling the first elastic member 100. Wet drilling is particularly advantageous as it will not leave residual oil or particles from the silicone on the first elastic member 100. The plurality of openings 102 may also be formed using other appropriate methods, such as by molding, regular drilling, laser drilling or by punching out the desired openings. An overall modulus of elasticity of the spring element 22 is thus dependent on the size and total number of openings 102 through the first elastic member 100. The overall modulus of elasticity of the spring element 22 is lower than the first modulus of elasticity of the first elastic member 100 in direct relation to the quantity of first elastomeric material removed from the first elastic member 100. The spring element 22 is thus more compressible.

The overall modulus of elasticity of the spring element 22 may be further changed by adding one or more second elastic members 104 to the first elastic member 100. The second elastic members 104 are comprised of a second elastomeric material having a second modulus of elasticity different from the first modulus of elasticity. The second elastic members 104 may be positioned in one or more of the openings 102 as desired. In the illustrated embodiment, the second elastic members 104 also comprise silicone which may be substantially solid or foam-like. The overall modulus of elasticity of the spring element 22 with the second elastic members 104 in the openings 102 will be at least greater than the overall modulus of elasticity of the spring element 22 with empty openings 102. Further, the overall modulus of elasticity of the spring element 22 may be greater than the first modulus of elasticity if the second elastomeric material is stiffer or more dense than the first elastomeric material.

Figure 8:
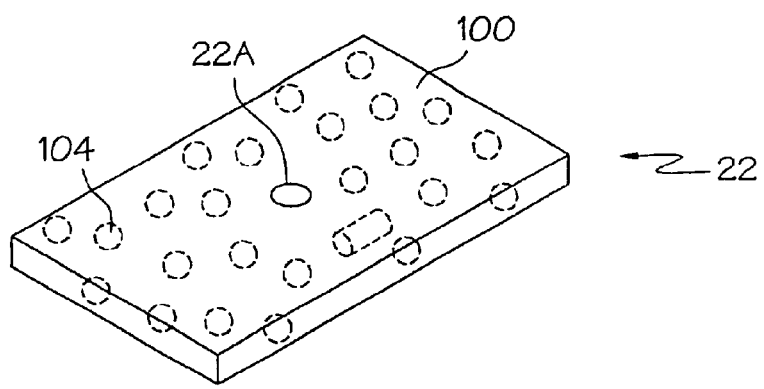
FIG. 8 is perspective view of a spring element according to a second embodiment of the present invention.

Referring now to FIG. 8, the spring element 22 according to a second embodiment of the present invention is shown, with like reference numerals corresponding to like elements. In this embodiment, one or more of the second elastic members 104 are positioned within the first elastic member 100. The second elastic members 104 are formed with the first elastic member 100 as the first elastic member 100 is fabricated. As with the first embodiment, the overall modulus of elasticity is dependent on the number and size of the second elastic members 104. The second elastic members 104 may have any desired shape. In the illustrated embodiment, the second elastic members 104 are generally spherical or oblong. The second elastic members 104 may be foam-like or substantially solid depending on the desired properties of the spring element 22.

Figure 9:
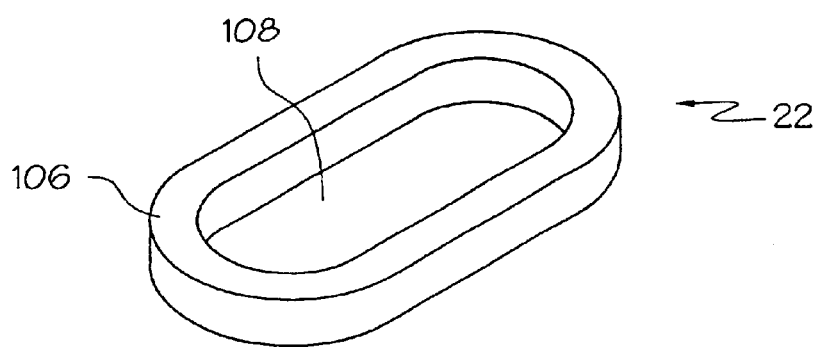
FIG. 9 is perspective view of a spring element according to a third embodiment of the present invention.

Referring now to FIG. 9, the spring element 22 according to a third embodiment of the present invention is shown. The spring element 22 comprises an elastic member 106 comprised of an elastomeric material having a modulus of elasticity. The elastic member 106 is shaped so that it engages an outer edge of the semiconductor 12 as it presses the semiconductor 12 against the interconnect structure 16. The spring element 22 of this embodiment includes a relatively large hole 108 through the elastomeric material such that the overall modulus of elasticity of the spring element 22 is different from the modulus of elasticity of the elastic member 106. As the spring element 22 engages the outer edge of the semiconductor 12, the force or pressure from the compressed spring element 22 is substantially uniform around the semiconductor 12. By engaging only the outer edge of the semiconductor 12, the applied force or pressure from the spring element 22 is substantially uniform compared to a sheet in which more force or pressure is applied to the center than the edges due to the deflection properties of a sheet versus an o-ring. In the illustrated embodiment, the elastic member 106 is o-ring shaped.

Figure 10:
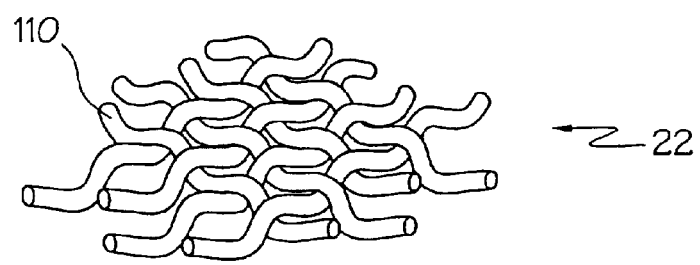
FIG. 10 is perspective view of a spring element according to a fourth embodiment of the present invention.

Referring now to FIG. 10, the spring element 22 according to a fourth embodiment of the present invention is shown. The spring element 22 comprises a plurality of interwoven threads 110. The amount in which the spring element of the fourth embodiment may be compressed is dependent, in part, to the size and the degree in which the threads 110 are woven together. The threads 110 are comprised of an elastomeric material which is silicone in the illustrated embodiment.

Figure 11:
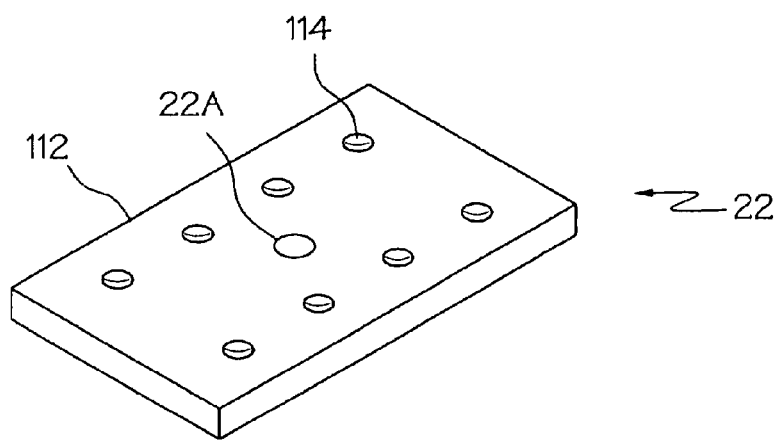
FIG. 11 is perspective view of a spring element according to a fifth embodiment of the present invention.

Referring now to FIG. 11, the spring element 22 according to a fifth embodiment of the present invention is shown. The spring element 22 comprises an elastic member 112 comprised of an elastomeric material having a modulus of elasticity. One or more cavities or dimples 114 are formed in the elastic member 112. The overall modulus of elasticity of the spring element 22 is thus dependent on the size and number of cavities 114. The cavities 114 may be formed by molding them into the elastic member 112 or by cutting cavities out of the elastic member 112. The cavities 114 may comprise any desired shape.

Figure 12:
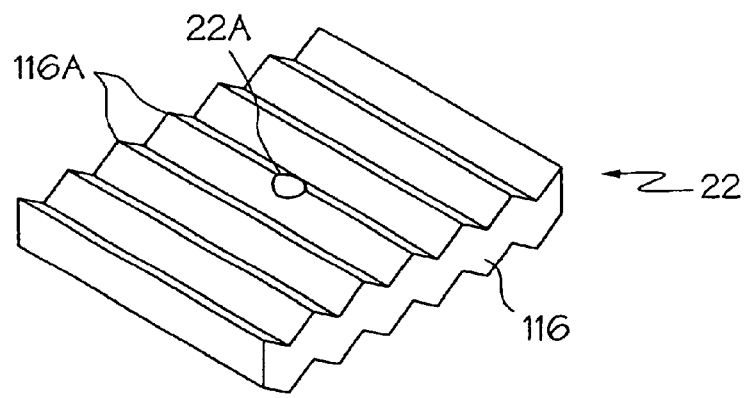
FIG. 12 is perspective view of a spring element according to a sixth embodiment of the present invention.

Referring now to FIG. 12, the spring element 22 according to a sixth embodiment of the present invention is shown. The spring element 22 comprises an elastic member 116 having a variable spring constant. The elastic member 116 has a repeating diamond shaped cross-section with a set of first peaks 116A and a set of second peaks 116B. The spring constant of the elastic member 116 changes based on the level of compression. The spring constant increases in direct proportion to the level of compression. The spring constant increases with compression because a greater amount of material is compressed. As there is less material near the peaks 116A, 116B, the amount of material compressed is less such that the spring constant is low. However, as compression increases, the amount of material compressed also increases such that the spring constant is higher. The elastic member 116 may have different shapes provided that the spring constant changes with the degree of compression. The elastic member 116 may have a triangular cross-section or a repeating triangular shaped cross-section. The elastic member 116 may be formed by molding or extruding an appropriate elastomeric material. The elastomeric material may be substantially solid or foam-like.

Figure 13:
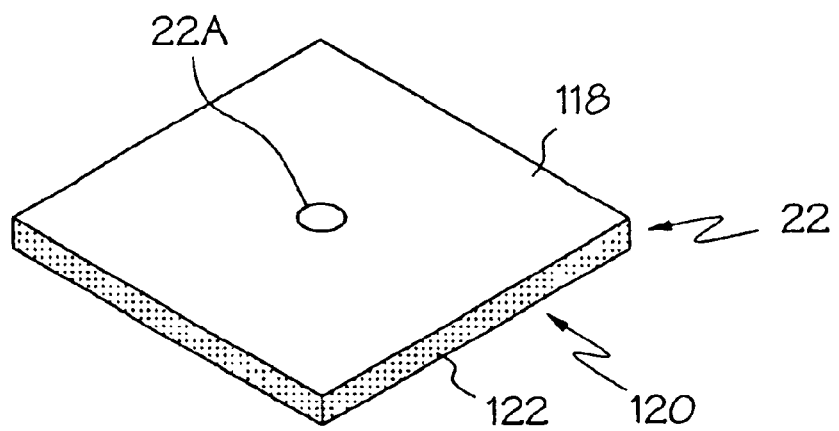
FIG. 13 is a perspective view of a spring element according to a seventh embodiment of the present invention.

Referring now to FIG. 13, a spring element 22 according to a seventh embodiment of the present invention is illustrated. The spring element 22 comprises an elastomeric material 118 having any of the above configurations and a conductive member 120. The conductive member 120 is configured so as to make the spring element 22 electrically conductive and/or to improve its thermal conductivity. An electrically conductive spring element 22 enables the semiconductor 12 to be backside biased through the spring element 22 as required for the particular test being performed. A spring element with improved thermal conductivity may be used in an application where heat dissipation is required.

As shown in FIG. 13, the conductive member 120 may take the form of a plurality of conductive particles 122 interspersed within the spring element 22. The concentration of conductive particles 122 is chosen so as to optimize the desired electrical and thermal conduction properties without adversely affecting the elasticity of the spring element 22. The conductive particles 122 may be mixed with the elastomeric material 118 as the spring element 22 is being formed. Another method of adding the conductive particles 122 to the spring element 22 is to inject them into the elastomeric material 118 after the spring element 22 is formed using known methods.

Figure 14:
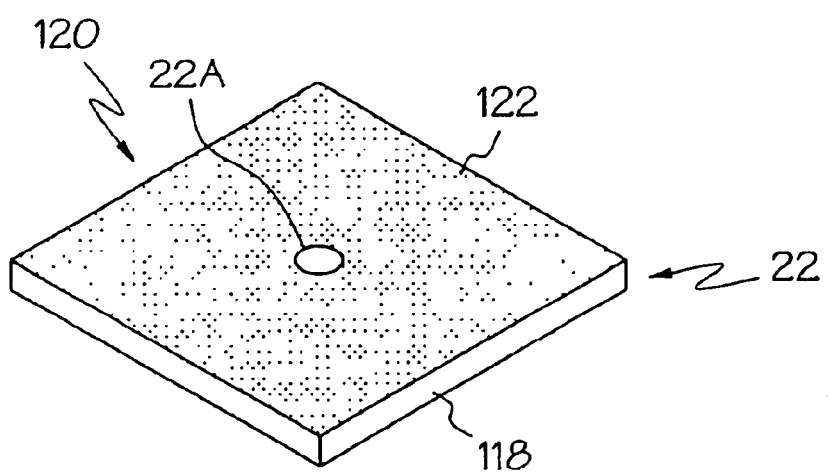
FIGS. 14–18 are perspective views of the spring element of FIG. 13 according to various aspects of the present invention.
Figure 15:
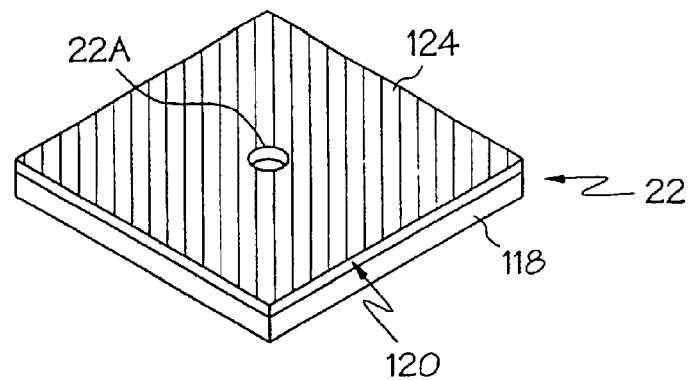

As shown in FIG. 14, the conductive particles 122 may also be applied to one or more surfaces of the spring element 22 using an appropriate adhesive. The concentration of the conductive particles 122 may be such that a layer of conductive material is formed on one or more surfaces of the spring element 22. In the alternative, a coating of conductive material 124 may be formed over one or more surfaces of the spring element 22 to form a layer of conductive material as shown in FIG. 15. Conductive material, in liquid form, may be applied to one or more surfaces of the spring element 22, as desired, using methods known in the art. The conductive material may also be applied by sputtering.

Figure 16:
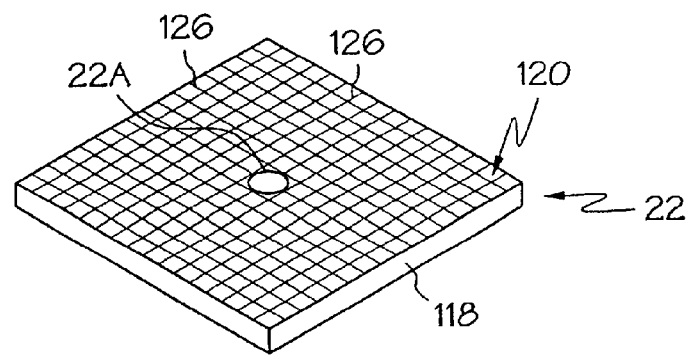
Figure 17:
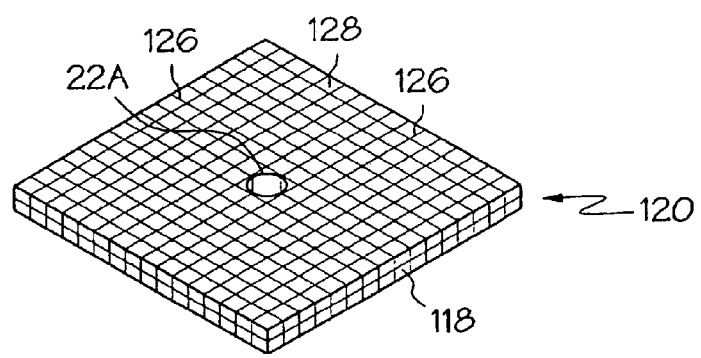
Figure 18:
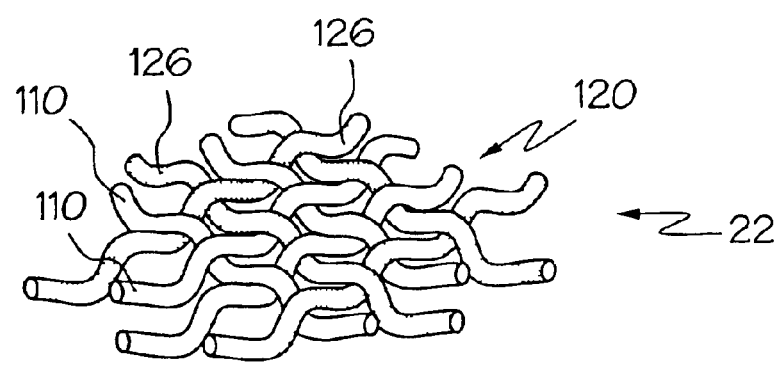

Referring now to FIGS. 16–18, the conductive member 120 may comprise a plurality of conductive threads 126. The conductive threads 126 may be set within the elastomeric material 118 as the spring element 22 is formed or the conductive threads 126 may be applied to one or more surfaces of the spring element 22 using an appropriate adhesive as shown in FIG. 16. Alternatively, the conductive threads 126 may be interwoven so as to form a fabric 128 of conductive material which is wrapped around the elastomeric material 118 as shown in FIG. 17. The fabric 128 may be arranged so as encase or cover the elastomeric material 118. Such a covering adds structural strength and protects the spring element 22 as well as being electrically and/or thermally conductive.

Referring now to FIG. 18, the spring element 22 may comprise the plurality of interwoven threads 110 and the plurality conductive threads 126 interwoven together. The ratio between threads 110 and conductive threads 126 may be adjusted so that the spring element 22 exhibits the desired elastic, electric and/or thermal properties. The conductive threads 126 may be formed of generally solid filaments of conductive material. Alternatively, the conductive threads 126 may be formed from filaments of non-conductive materials which are coated with conductive material.

The conductive material forming the conductive member 120 may be any desired electrically or thermally conductive material appropriate for the particular application. The conductive material may be comprised of any appropriate metal, such as gold, aluminum, nickel, silver, stainless steel, and alloys thereof. The conductive material may also be comprised of carbon in diamond or graphite crystalline form. Diamond is particularly advantageous as it has very high thermal conductivity while graphite is electrically conductive.

Figure 19:
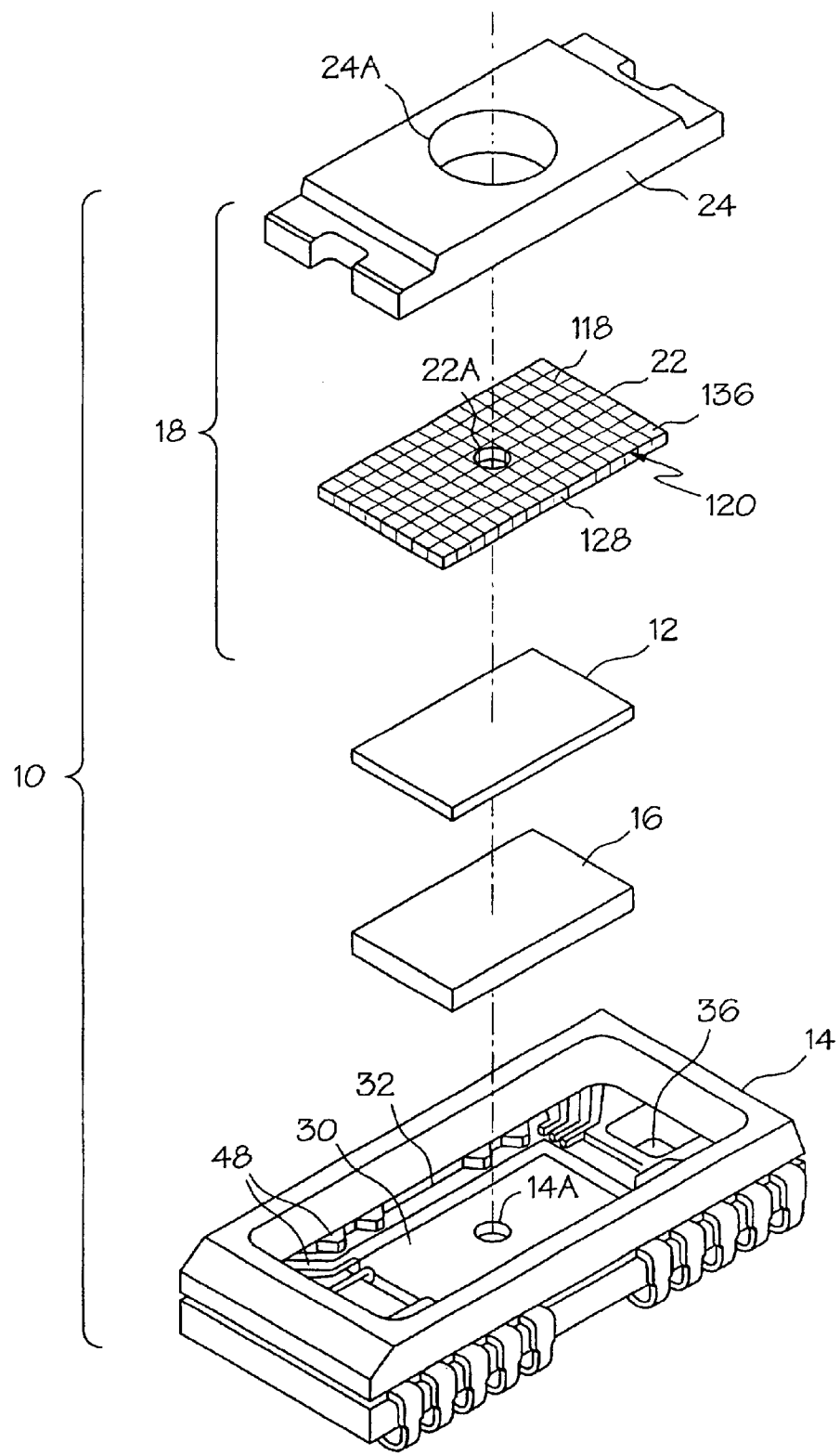
FIG. 19 is an exploded view of a temporary package for testing semiconductors using a spring element having a conductive material.

Referring now to FIG. 19, another temporary package 10' used for testing a semiconductor 12 is shown, with like reference numerals corresponding to like elements. The spring element 22 is covered with the fabric 128 of conductive material. As the fabric 128 increases the strength and structural integrity of the spring element 22, the force applied by the cover 24 to the spring element 22 is better distributed to the semiconductor 12. Accordingly, the pressure plate is not needed as its function is performed by the spring element 22 through the fabric 128. However, the pressure plate may still be used as desired.

Figure 20:
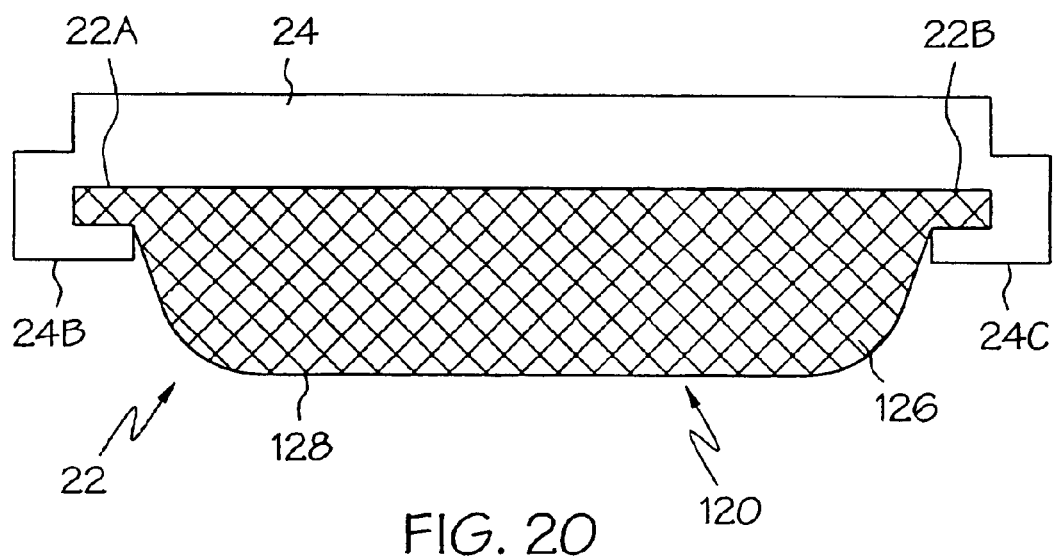
FIG. 20 is a side view of the cover and spring element of FIG. 19 coupled together.

Further, the added strength provided by the fabric 128 allows the spring element 22 to be mechanically coupled to the cover 24 as shown in FIG. 20. The cover 24 includes a first clamp 24B and a second clamp 24C for latching or clamping the spring element 22 to the cover 24. A first end portion 22A of the spring element 22 is compressed and clamped to the cover 24 by the first clamp 24B while a second end portion 22B of the spring element 22 is compressed and clamped to the cover 24 by the second clamp 24C. It will be appreciated by those skilled in the art that all of the end portions of the spring element 22 may be clamped to the cover 24.

In the illustrated embodiment, the spring element 22 is force fit to the cover 24 as the first and second clamps 24B and 24C comprise static latching shelves with the first and second end portions 22A and 22B being slid in place between the first and second clamps 24B and 24C. The spring element 22 may be easily removed from the cover 24 by applying sufficient force to overcome the force being applied by the clamps 24B and 24C. A new spring element 22 may then be slid and latched in place. Such a clamping device is cleaner and easier to use than adhesives. However, the spring element 22 may be adhered to the cover 24 as desired. It will be appreciated by those skilled in the art that other mechanical latching devices may be used to clamp the spring element 22 to the cover 24.

It will be appreciated by those skilled in the art that the spring element 22 may have any combination of the above embodiments. The final configuration of the spring element 22 will be dependent on the desired physical properties of the spring element 22 as well as the dimensional limitations for each particular package 10 and semiconductor 12. It will be further appreciated by those skilled in the art that the spring element 22 may be used with other temporary packages used to test semiconductors.

Having described the invention in detail and by reference to preferred embodiments thereof, it will be apparent that modifications and variations are possible without departing from the scope of the invention defined in the appended claims.

What is claimed is:

1. A spring element comprising a first elastic member and a conductive member, said first elastic member being comprised of a first elastomeric material having a first modulus of elasticity, said first elastic member having a portion of said first elastomeric material removed, forming a hole in said first elastic member such that said spring element has an overall modulus of elasticity different from said first modulus of elasticity.

2. The spring element of claim 1, wherein said first elastic member is o-ring shaped.

3. The spring element of claim 1, wherein said first elastic member has a plurality of holes formed therein.

4. The spring element of claim 3, further comprising a second elastic member comprised of a second elastomeric material having a second modulus of elasticity, said second elastic member positioned in at least one of said plurality of holes formed in said first elastic member such that said overall modulus of elasticity is different from said first and second moduli of elasticity.

5. The spring element of claim 4, further comprising a plurality of said second elastic members, said plurality of said second elastic members positioned in a plurality of said plurality of holes in said first elastic member.

6. The spring element of claim 1, wherein said conductive member comprises a plurality of conductive particles.

7. The spring element of claim 6, wherein said plurality of conductive particles are interspersed within said first elastic member.

8. The spring element of claim 1, wherein said conductive member comprises a layer of conductive material formed over said first elastic member.

9. The spring element of claim 1, wherein said conductive member comprises a plurality of conductive threads.

10. The spring element of claim 9, wherein said plurality of conductive threads comprise a plurality of non-conductive threads having a conductive coating.

11. The spring element of claim 9, wherein said plurality of conductive threads form a covering around said first elastic member.

12. The spring element of claim 1, wherein said conductive member is comprised of conductive material selected from the group consisting of gold, aluminum, nickel, silver, stainless steel, and alloys thereof.

13. A spring element comprising a first elastic member, a second elastic member and a conductive member, said first elastic member being comprised of a first elastomeric material having a first modulus of elasticity, said second elastic member being comprised of a second elastomeric material having a second modulus of elasticity, said second elastic member positioned within said first elastic member such that said spring element has an overall modulus of elasticity different from said first and second moduli of elasticity.

14. The spring element of claim 13, further comprising a plurality of said second elastic members positioned within said first elastic member.

15. The spring element of claim 13, wherein said conductive member comprises a plurality of conductive particles.

16. The spring element of claim 13, wherein said conductive member comprises a layer of conductive material formed over said first elastic member.

17. The spring element of claim 13, wherein said conductive member comprises a plurality of conductive threads.

18. A spring element comprising a plurality of elastomeric threads interwoven with conductive threads.

19. A spring element comprising a conductive member and an elastic member having a variable spring constant, said conductive member comprising a plurality of conductive particles disposed within said elastic member.

20. A spring element comprising a conductive member and an elastic member having a variable spring constant, said conductive member comprising a plurality of conductive particles disposed on top of said elastic member.

21. A spring element of comprising a conductive member and an elastic member, said conductive member comprising a layer of conductive material formed at least on a surface of or within said elastic member.

22. The spring element of claim 21, wherein said conductive member comprises a plurality of conductive threads.

23. The spring element of claim 1, wherein said conductive member comprises carbon.

24. A spring element according to claim 18, further comprising a layer of conductive material formed over an elastic member.

* * * * *